United States Patent [19]

Todokoro

[11] Patent Number: 4,855,673
[45] Date of Patent: Aug. 8, 1989

[54] ELECTRON BEAM APPARATUS

[75] Inventor: Hideo Todokoro, Tokyo, Japan

[73] Assignee: Hitachi, Ltd., Tokyo, Japan

[21] Appl. No.: 156,458

[22] Filed: Feb. 16, 1988

[30] Foreign Application Priority Data

Mar. 20, 1987 [JP] Japan .................................. 62-63775

[51] Int. Cl.$^4$ .......................... G01R 1/06; G01R 1/067
[52] U.S. Cl. .............................. 324/158 R; 324/158 F; 324/158 P
[58] Field of Search ............... 324/72.5, 158 P, 158 F, 324/158 D, 158 R; 250/310, 311; 336/84 R, 84 C

[56] References Cited

U.S. PATENT DOCUMENTS

| | | | |
|---|---|---|---|
| 3,736,541 | 5/1973 | Gould | 336/84 C |
| 3,992,073 | 11/1976 | Buchoff et al. | 324/72.5 |
| 4,116,523 | 9/1978 | Coberly et al. | 324/158 P |
| 4,532,423 | 7/1985 | Tojo et al. | 324/158 F |
| 4,697,143 | 9/1987 | Lockwood et al. | 324/158 F |
| 4,740,746 | 4/1988 | Pollock et al. | 324/158 F |

FOREIGN PATENT DOCUMENTS 60-6876 1/1985 Japan .

OTHER PUBLICATIONS

"Character of Secondary Electron Spectrometer Designed for Wafer Probing" by Uchida et al, Japan Soc. for Prom. of Sci., Applic. of Changed Part. Beam to Industry, #132 Committee, #97 research conf. Reports, pp. 108-111.

Primary Examiner—Reinhard J. Eisenzopf
Assistant Examiner—W. Burns
Attorney, Agent, or Firm—Antonelli, Terry & Wands

[57] ABSTRACT

In an electron beam apparatus in which an electron beam is irradiated on a specimen, secondary electrons are generated from the specimen under the bombardment of the electron beam, and voltage is applied to and a signal voltage is picked up from the specimen through a probe, a metal electrode is disposed on at least part of the outer peripheral surface of the probe through an insulator and the metal electrode is maintained at predetermined electrical potential. The secondary electrons can be shielded from a horizontal electric field generated from the probe and can be detected accurately by means of a detector.

7 Claims, 5 Drawing Sheets

ELECTRON BEAM APPARATUS

BACKGROUND OF THE INVENTION

This invention relates to an electron beam apparatus and more particularly to an electron beam apparatus suitable for accurately measuring characteristics of semiconductor circuits, formed on a wafer, by using an electron beam tester.

The electron beam tester has been used to inspect semiconductor devices formed on a wafer and for the inspection, as discussed in Japan Society for the Promotion of Science, Application of Charged Particle Beam to Industry No. 132 Committee, No. 97 Research Conference Reports, pp. 108-111. The wafer is placed within a specimen chamber and semiconductor circuits on the wafer are operated under the application of voltage fed through a probe card which is brought into contact with the wafer. Encountered in this measurement, however, is a problem-that a probe of the probe card is held on one of bonding pads surrounding a semiconductor circuit in substantially vertical relationship to the one bonding pad and consequently a horizontal electric field generated from the probe tends to disturb loci of secondary electrons in the vicinity of the probe.

More particularly, as diagramatically shown in FIG. 2, a probe 3 affects secondary electrons. The probe 3 is held in contact with a pad 4 formed on a silicon substrate 6. In the electron beam tester, an electron beam 1 is irradiated or bombarded on one of wiring conductors formed on the silicon substrate 6, for example, a conductor 5 and energy of secondary electrons 2 emitted or excited from a bombarded portion is analyzed to measure electrical potential at the conductor 5. The manner of analyzing energy of the secondary electrons is detailed in JP-A-60-6876 and will not be described herein.

The measurement is however affected adversely by the probe 3 when conducted under the application of a voltage of, for example, 5V through the probe. Since mean energy of the secondary electrons 2 is as low as about 2 eV, the secondary electrons are drawn along a horizontal (more generally, transverse) electric field generated from the probe 3 and can not be detected by means of a detector (not shown) disposed upwardly of the probe card. Presumably, this adverse influence may be avoided by applying a vertical (more generally, longitudinal) electric field which can overcome the horizontal electric field due to the probe 3 but practically the application of the intensive vertical electric field sufficient to overcome the horizontal electric field is difficult to achieve near the probe.

SUMMARY OF THE INVENTION

An object of this invention is to provide an electron beam apparatus capable of being unaffected by the horizontal electric field due to the probe in order to detect secondary electrons accurately.

According to preferred embodiments of the invention, the above object can be accomplished by providing a shield electrode for shielding the horizontal electric field due to the probe on the probe at its surface confronting the electron beam, or by making a distance between the probe and the secondary electrons sufficiently large. Preferably, the shield electrode is applied with a positive electrical potential to generate a vertical electric field which assists in efficiently drawing the secondary electrons toward the detector disposed upwardly of the probe.

The principle of the present invention will first be described with reference to FIG. 1. A probe 3 according to teachings of the invention has, on its surface confronting an electron beam 1, a shield electrode 8 which is electrically insulated from the probe 3 through an insulator 7 and which is maintained at earth potential. The shield electrode 8 is effective to shield a horizontal electric field generated from the probe 3 when the probe is applied with voltage. Consequently, secondary electrons 2 discharged from a wiring conductor 5 when the electron beam 1 impinges upon the conductor 5 can not be drawn by the electric field due to the probe but can be drawn upwards as illustrated in FIG. 1. Generally, for efficient detection of the secondary electrons, a grid is disposed upwardly of the probe card and applied with positive electrical potential and in this case, the shield electrode 8 is also applied with positive potential so as to provide a substantially uniform vertical electric field acting on the secondary electrons.

DESCRIPTION OF THE PREFERRED EMBODIMENTS

Figure 3:
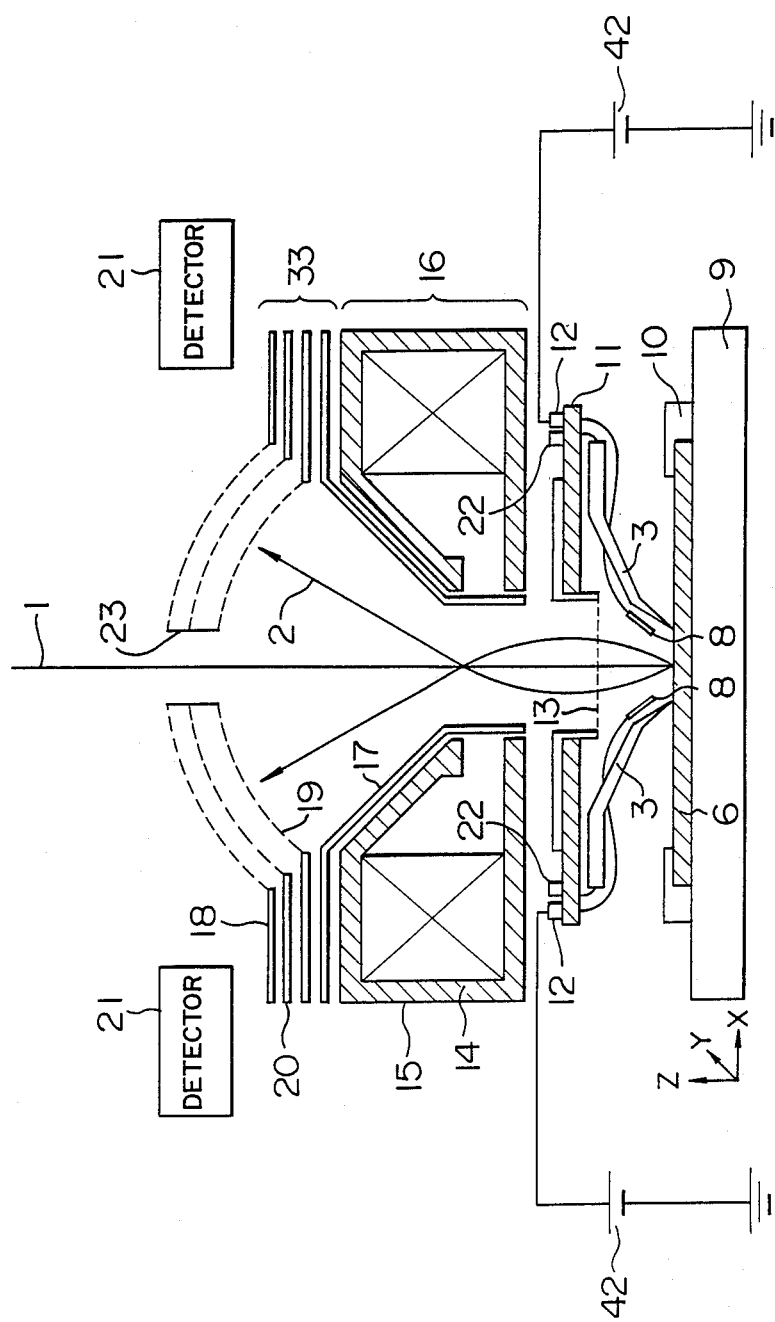
FIG. 3 is a schematic diagram illustrating an electron beam apparatus according to an embodiment of the invention.

Referring now to FIG. 3, there is illustrated an electron beam apparatus according to an embodiment of the invention. A wafer 6 on which semiconductor circuits are formed is fixed on a stage 9 by means of a fixture 10. The stage 9 is movable in X, Y and Z directions by means of a fine movement mechanism not shown. In measurement, a probe or probes 3 adapted to apply voltage to and to transmit/receive signals with respect to semiconductor circuits formed on the wafer 6 is brought into contact with the semiconductor circuits. The probe 3 is integral with a probe substrate 11 to provide a so-called probe card. For the application of externally supplied voltage and for the transmission/reception of signals, the probe 3 is connected to an external device (not shown) through terminals 22 formed on the probe substrate 11. An electron beam 1 is focused on the wafer 6 by means of an objective lens 16 comprised of a lens coil 14 and a magnetic circuit 15. The electron beam 1 is deflectable to a desired position on the wafer for the sake of obtaining a scanning image and of irradiating the electron beam on a measuring portion. A mechanism to this end, however, is not illustrated in FIG. 3. Secondary electrons 2 emitted from a semiconductor circuit on the wafer under the bombardment of the electron beam 1 are drawn upwards by means of an extraction grid 13 and an acceleration grid 17 which are applied with positive electrical potential. For example, the extraction and acceleration grids 13 and 17 are applied with 300V. The thus accelerated secondary electrons 2 are once focused as illustrated in FIG. 3 by means of the objective lens 16 and then go into an energy analyzer 33 comprised of three mesh plates or grids. In the energy analyzer 33, the outer grid 18 and the inner grid 19 are interconnected together by a cylinder 23 disposed in the path for the electron beam 1 and they are applied with about 150V positive potential. The intermediate or analyzing grid 20 is applied with negative potential. The secondary electrons passing through the energy analyzer 33 are detected by a detector 21. The analyzer of the above construction provides a retarding type energy analyzer for the secondary electrons 2 by which the level of electrical potential at a bombarded portion can be measured. The principle of potential measurement based on the analyzing grid 20 is detailed in the aforementioned JP-A-60-6876 and will not be described herein.

Figure 1:
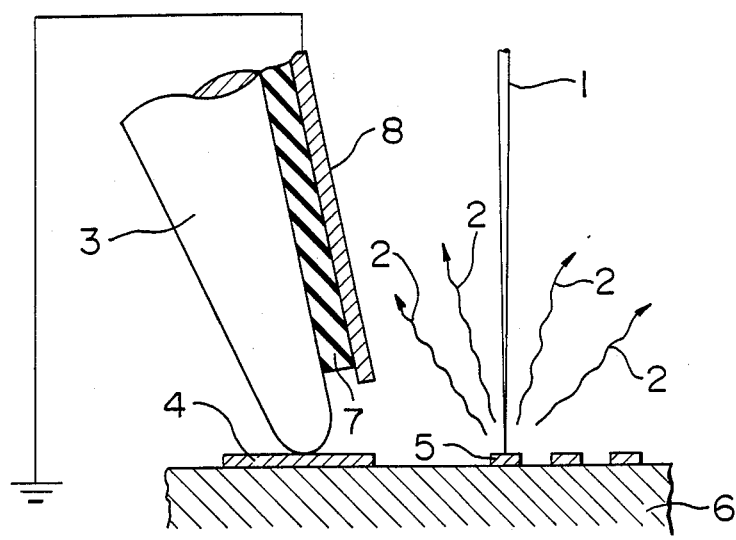
FIG. 1 is a diagram useful in explaining the principle of the invention.
Figure 2:
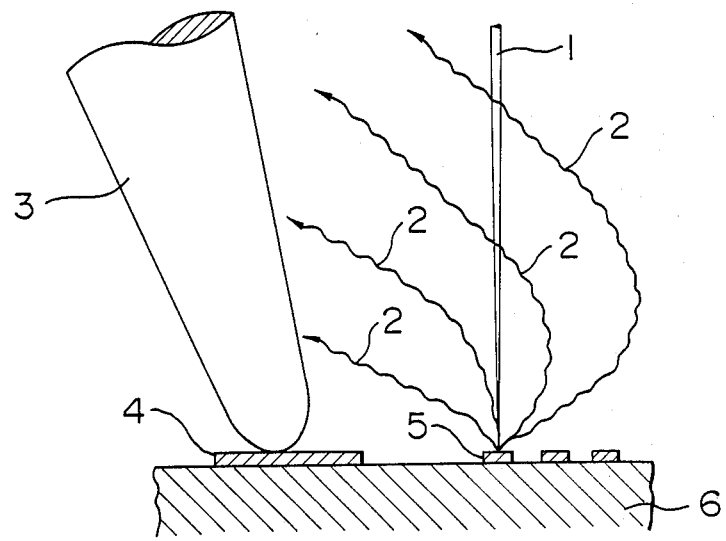
FIG. 2 is a diagram useful in explaining the problem encountered in an electron beam apparatus using a prior art

As described previously with reference to FIG. 2, a horizontal electric field generated from the probe 3 disturbs loci of the secondary electrons 2. To overcome this problem, in this embodiment, the probe 3 is added, at its surface confronting the electron beam, with a shield electrode 8 which is applied with positive potential from a power supply 42.

Embodiments of the shield electrode 8 will now be described.

Figure 4:
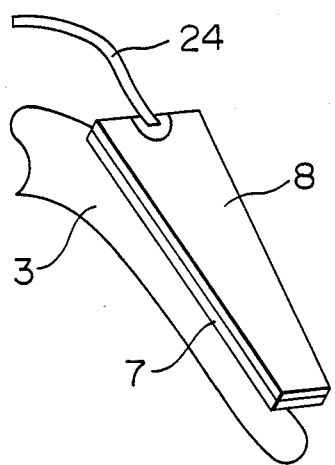
FIGS. 4, 5 and 7 are fragmentary perspective views illustrating embodiments of a shield electrode according to the invention adapted to shield the horizontal electric field generated from the probe.

FIG. 4 illustrates an embodiment of the shield electrode which is used in the apparatus of FIG. 3. In this embodiment, a wedge-shaped plate member comprised of an insulating plate 7 and a shield electrode plate 8 which are bonded together is bonded to the probe 3. The shield electrode 8 is connected with a lead wire 24 through which the shield electrode 8 is applied with electrical potential.

Figure 5:
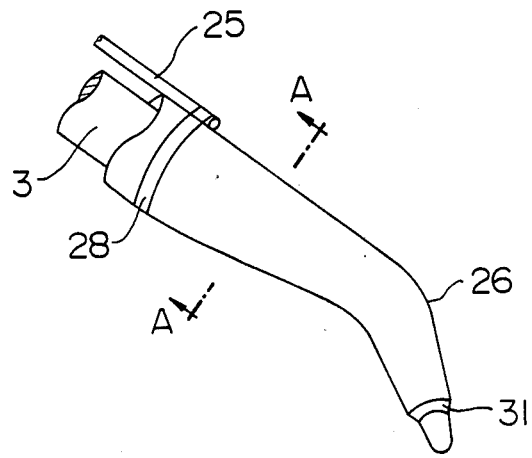
Figure 6:
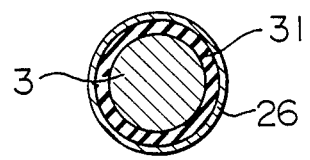
FIG. 6 is a sectional view taken on the line A—A' of FIG. 5.

FIG. 5 illustrates another embodiment of the shield electrode and FIG. 6 illustrates a crossectional view taken on the A—A' line of FIG. 5. In this embodiment, the surface of the probe 3 is covered with a thin insulating film 31 having a thickness of 10 to 100 $\mu$m. The insulating film 31 can be formed by immersing the probe 3 in a molten organic material and subsequently pulling up and drying the probe 3. The insulating film is partly removed at only the tip portion of the probe. A lead wire 25 is bonded to the insulating film 31 or fixed thereto by means of a band 28. Thereafter, a resulting structure is deposited with metal through vapor deposition to form an outer metal film 26. To avoid deposition to the shoulder at the tip portion, the metal may preferably be vapor deposited laterally of the probe. In place of the lead wire 25, a leaf spring in contact with the outer metal film 26 may be used for applying electrical potential to the film 26.

Figure 7:
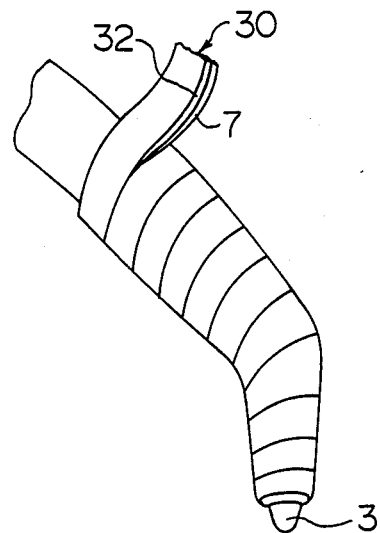

FIG. 7 illustrates still another embodiment of the shield electrode wherein a strip member 30 comprised of a thin metal sheet 32 and an insulating sheet 7 which are bonded together is wound about the probe 3. In this embodiment, the strip member 30 may also serve as a lead wire.

Figure 8:
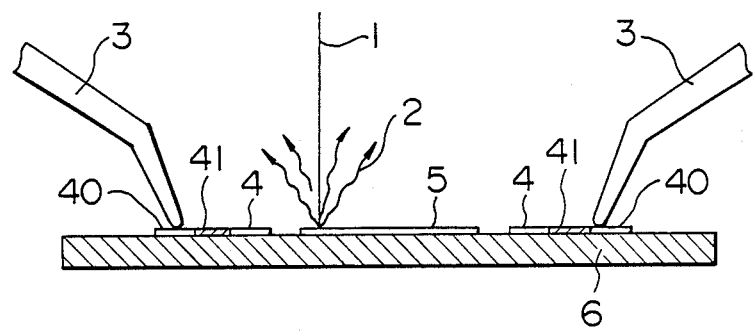
FIG. 8 is a diagram illustrating, in side view form, an arrangement according to the invention which can prevent the influence of the probe upon the secondary electrons.
Figure 9:
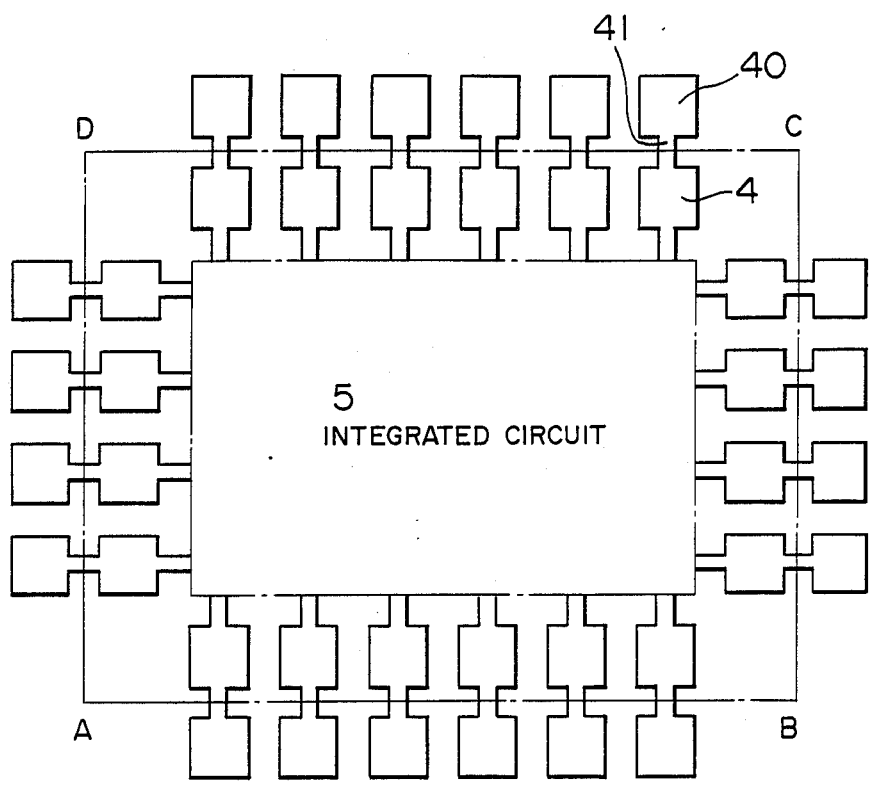
FIG. 9 is a plan view of the FIG. 8 arrangement.

Referring to FIGS. 8 and 9, there is illustrated an arrangement according to the invention which can prevent the influence of the probe upon the secondary electrons in which FIG. 8 is a sectional view cut in AB line in FIG. 9. In this arrangement, the conventionally used pad 4 is connected in series with a second pad 40 through a connection wiring conductor 41. In measurement, a probe 3 is held uprightly on the second pad 40. Since the second pad 40 is more distant from the electron beam 1 than the conventional pad 4, a horizontal electric field generated from the probe 3 has no influence upon an integrated circuit 5 with the result that secondary electrons generated under the bombardment of the electron beam 1 can be drawn upwards to assure accurate measurement. In packaging the integrated circuit, cutting may be carried out along a portion which lies outwardly of the pads 4, so that the pads 4 may be left behind to mate with the integrated circuit. Preferably, as shown in FIG. 9, cutting may be done along a line ABCD which overlies the connection wiring conductors 41, thus leaving behind pads for bonding which resemble the conventional pads.

The provision of the connecting wiring conductor 41 is convenient for cutting but alternatively, a rectangular pad in which the conventional pad 4 and the second pad 40 are united into a rectangular form may be used. In this case, cutting is done at the central portion of the rectangular pad.

In this arrangement, the conventional probe may be used with its adverse influence upon the secondary electrons suppressed but more preferably, the probe provided with the shield electrode in accordance with the previous embodiments is used to advantage.

As described above, according to the invention, the secondary electrons can be detected accurately without being affected by the horizontal electric field generated from the probe.

I claim:
1. An electron beam apparatus comprising:
   means for irradiating an electron beam on a specimen;
   detection means for detecting secondary electrons generated from said specimen under the bombardment of the electron beam;
   a probe for applying a voltage to said specimen and picking up a signal voltage from said specimen; and
   shield means for shielding the secondary electrons from an electric field generated from said probe.
2. An electron beam apparatus according to claim 1 wherein said shield means comprises a metal electrode disposed proximate to and electrically insulated from at least part of the outer peripheral surface of said probe by an insulator, and potential maintaining means for maintaining said metal electrode at a predetermined electrical potential.
3. An electron beam apparatus according to claim 2 wherein said potential maintaining means maintains said metal electrode at predetermined positive potential.
4. An electron beam apparatus according to claim 2 wherein said metal electrode is disposed proximate to said probe at only its surface confronting the electron beam.
5. An electron beam apparatus according to claim 2 wherein said metal electrode is a metal strip which is toroidally wound about said probe.
6. An electron beam apparatus according to claim 2 wherein said insulator is an insulating film formed on the surface of said probe, and said metal electrode is a metal film formed on said insulating film.
7. An electron beam apparatus according to claim 2 wherein said insulator is disposed on at least part of the outer peripheral surface of said probe and said metal electrode is disposed on said insulator.

* * * * *